United States Patent [19]

Tomaszewski et al.

[11] Patent Number: 4,866,502
[45] Date of Patent: Sep. 12, 1989

[54] RC LINE

[75] Inventors: Zbigniew Tomaszewski; Gerhard Tröster, both of Heilbronn, Fed. Rep. of Germany

[73] Assignee: Telefunken electronic GmbH, Heilbronn, Fed. Rep. of Germany

[21] Appl. No.: 136,741

[22] Filed: Dec. 22, 1987

[30] Foreign Application Priority Data

May 2, 1987 [DE] Fed. Rep. of Germany ....... 3714672

[51] Int. Cl.⁴ ..................... H01L 27/02; H01L 23/48; H01L 29/04
[52] U.S. Cl. ...................................... 357/51; 357/68; 357/59
[58] Field of Search ................ 357/51, 68, 59 G, 59 J, 357/59 K, 53

[56] References Cited

U.S. PATENT DOCUMENTS

| 4,285,001 | 8/1981 | Gerzberg et al. | 357/50 |
| 4,399,417 | 8/1983 | Ballantyne et al. | 357/51 |
| 4,560,963 | 12/1985 | Sharpe | 357/51 |
| 4,620,212 | 10/1986 | Ogasawara | 357/51 |

OTHER PUBLICATIONS

Bhupendra K. Ahuja, "Implementation of Active Distributed RC Anti-Aliasing/Smoothing Filters", IEEE Journal of Solid-State Circuits, vol. SC-17, No. 6, Dec. 1982, pp. 1076-1080.
Dipl.-Ing. Gerhard Tröster, "Analog Time-Continuous Filters in NMOS Technology", Progress Report of the Association of German Engineers, Series 9, 1984, pp. 110-119.
K. Setsune et al, "Hydrogenation for Polysilicon MOSFET's by Ion Shower Doping Technique", IEEE Electron Device Letters, vol. EDL-7, No. 11, Nov. 1986, pp. 618-620.

Primary Examiner—Rolf Hille
Assistant Examiner—Robert P. Limanek
Attorney, Agent, or Firm—Spencer & Frank

[57] ABSTRACT

The invention relates to RC lines which are used as components in filter synthesis, with resistors and capacitors not being arranged as discrete components alongside one another but as a three-layer structure consisting of two conductive polysilicon layers and an oxide layer located between these in superimposed relation on a semiconductor substrate. The two polysilicon layers form together with the oxide layer a distributed capacitor, with one conductive polysilicon layer constituting an ohmic resistor. The planar configuration of the polysilicon layers and the oxide layer results in parasitic ohmic resistors which impair the electrical properties of the RC line to a considerable extent. In accordance with the invention, these parasitic ohmic resistors are eliminated by both the two polysilicon layers and the oxide layer located between these being of a strip conductor-path-type structure, and by the three paths being folded or rolled in a space-saving manner parallel to the plane of the semiconductor substrate and lying in congruent superimposed relation to one another.

11 Claims, 6 Drawing Sheets

RC LINE

BACKGROUND OF THE INVENTION

The invention relates to an RC line as a three-layer structure on a semiconductor substrate consisting of two conductive polysilicon layers and an oxide layer arranged between these two layers, one of the polysilicon layers constituting the ohmic resistor and simultaneously the first capacitor plate, the other polysilicon layer forming the second capacitor plate, and the oxide layer being the dielectric.

RC lines are known for different applications and are manufactured by the standard technologies such as MOS, NMOS and CMOS technology or a technology which is a combination of bipolar and CMOS technology. RC lines are used as components for filter synthesis, with resistors and capacitors arranged not as discrete components alongside one another but in superimposed relation to one another, by means for which an RC-distributed element is built up. RC lines are also used as delay line in filters and generators. Time-continuous filters can be produced as active filters with RC lines. Active filters with RC lines are also used as anti-aliasing or smoothing filters for analog sampling systems.

A distributed RC element is known as an RC line in MOS technology from the IEEE Journal of Solid-State Circuits, Volume SC-17, No. 6, December 1982, pages 1076–1080. Arranged on a substrate are two polysilicon layers, with the upper layer forming the resistor and the capacitor being formed by both polysilicon layers. Active filters with RC lines are also dealth with in progress reports of the periodicals of the Association of German Engineers, Series 9, Analog Time-Continuous Filters in NMOS Technology, 1984, pages 110–119. There, RC lines in NMOS technology are made from RC-distributed elements by similarly arranging three layers, namely a first meander-shaped polysilicon layer, then an oxide layer and finally a second planar polysilicon layer on a field-oxide layer which, in turn, is arranged on a semiconductor substrate. The first polysilicon layer forming the resistor is simultaneously the first capacitor plate of capacitor C whose second capacitor plate is formed by the second polysilicon layer and whose dielectric is constituted by the oxide layer. This RC-distributed element can also be built up in the reverse manner by the first polysilicon layer forming the second capacitor coating and the ohmic resistor being located in the second polysilicon layer which simultaneously constitutes the first capacitor plate.

The advantages of an RC line comprised of RC-distributed elements over an RC member with discrete components is that an RC-distributed element requires less chip surface and its rise in attenuation above the 3 dB frequency is greater.

FIG. 1 shows a known RC-distributed element with a three-layer structure 2 which consists of the first polysilicon layer 3, the oxide layer 5 and the second polysilicon layer 4 and which is arranged on a semiconductor substrate 1 with a field-oxide layer 9. The polysilicon layer 3 forms the second capacitor plate of capacitor C, the polysilicon layer 4 forming resistor R constitutes its first capacitor plate and the oxide layer 5 its dielectric.

The equivalent circuit diagram of the RC line drawn in this Figure shows the resistors $R_i$ adding up to the total resistance R, the capacitors $C_i$ comprising the total capacitance C and the parasitic ohmic resistors $R_t$ and $R_1$. These parasitic ohmic resistors $R_t$ and $R_1$ result from the planar configuration of the first polysilicon layer 3 and impair the electrical properties of the RC line to a considerable extent by, for example, the delay time of the RC line being unfavorably altered or the selectivity in analog sampling systems being impaired.

SUMMARY OF THE INVENTION

The object underlying the invention is to provide an RC line in which the above-mentioned parasitic ohmic resistors $R_t$ and $R_1$ are eliminated.

This object is achieved in an RC line of the kind described at the beginning, in accordance with the invention, by both the polysilicon layers and the oxide layer located between these being of strip-path-type structure, by both the resistance path forming the first capacitor plate and the paths forming the second capacitor plate and the dielectric, respectively, being folded or rolled in a space-saving manner parallel to the plane of the semiconductor substrate, and by the layers of the paths lying in congruent superimposed relation to one another.

The inventive design of such RC lines results in substantial improvement of the frequency characteristics as parasitic ohmic couplings between neighboring parts of the line are eliminated. A further advantage is that the manufacture of such RC lines does not require any technology beyond the standard MOS technology.

BRIEF DESCRIPTION OF THE DRAWINGS

The invention and its embodiments will be explained below in further detail with reference to the drawings, in which.

DESCRIPTION OF THE PREFERRED EMBODIMENTS

Figure 1:
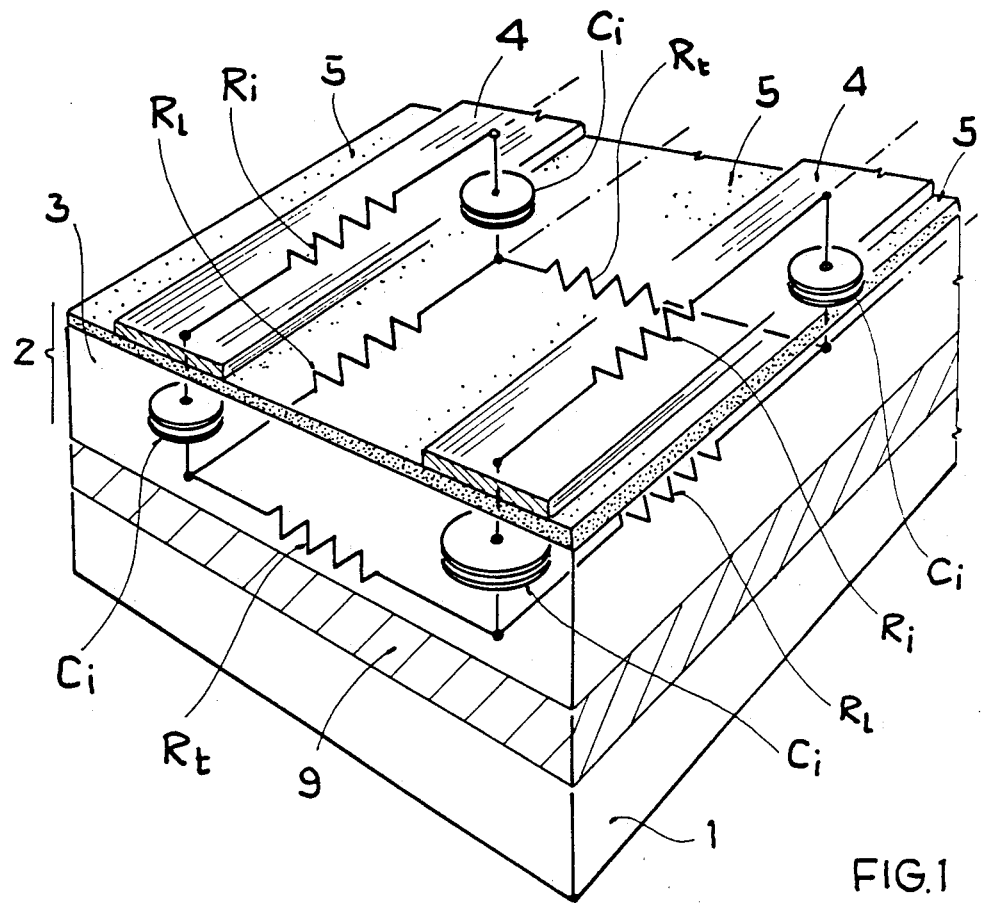
FIG. 1 is a perspective illustration of a known RC line with an equivalent circuit diagram.

Embodiments of the invention whose three-layer structure 2 is arranged on a field-oxide layer 9, consisting, for example, of $SiO_2$ and located on a semiconductor substrate 1 consisting of a p-conductive silicon, will first be described with reference to FIGS. 2a to 5b. The three-layer structure 2 is a strip of conductor-path design in the form of a meander consisting of branches 8 and corners 7. The first path, polysilicon layer 3, is arranged on the field-oxide layer 9, the second path, the oxide layer 5, is arranged on the first path, and the third path, the polysilicon layer 4, is then arranged on the second path. Hence the three strip paths lie in congruent superimposed relation to one another. The meander-like structure is apparent, in particular, in the Figures designated b with their plan views. In accordance with the invention, the perspective illustrations of the Figures designated a show the strip conductor-path-type design of the polysilicon layers 3 and 4 and the oxide layer 5 compared with the planar design according to the prior art shown, for example, in FIG. 1, with the transverse parasitic ohmic resistors $R_5$ thereby being eliminated. The path of the polysilicon layer 3 and 4, respectively, has a width of, for example, 7 μm and 6 μm, respectively, and both paths have a thickness of approximately 1 μm, with the oxide layer 5 being approximately 0.09 μm thick. The spacing of the branches of the meander which are approximately 500 μm long is preferably 6 μm. The thickness of the semiconductor substrate 1 and the field-oxide layer 9 is, for example, 500 μm and 10 μm, respectively. The length of the meander depends on the number of branches 8 and corners 7.

The three-layer structure 2 is covered by a further oxide layer 10 consisting of $SiO_2$ with a thickness of approximately 0.9 μm. Finally, that polysilicon layer 3 or 4 which forms the second capacitor plate of capacitor C is contacted by a metal contact 6 consisting of aluminum.

Figure 5A:
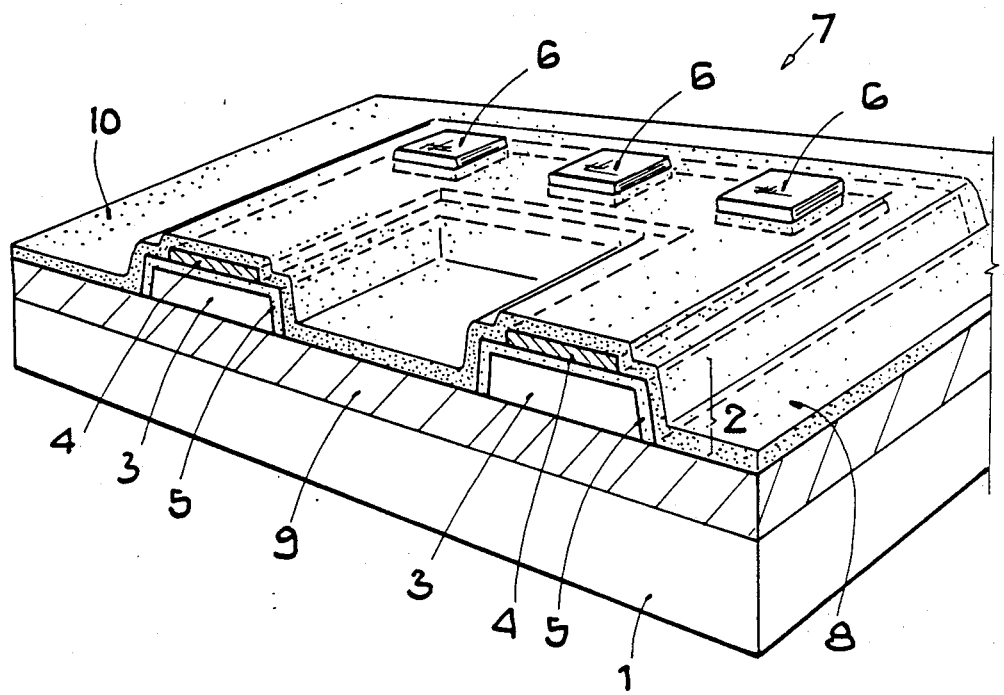
Figure 5B:
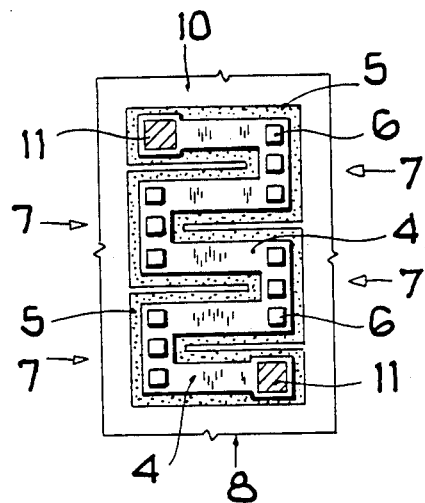

The embodiments of FIGS. 2a–4b differ from the embodiment of FIGS. 5a and 5b in that the function of the layers of the three-layer structure 2 is different. In the embodiments of the first group of Figures, the polysilicon layer 4 assumes the function of resistor R as resistance path and simultaneously that of the first capacitor plate of capacitor C, and the polysilicon layer 3 constitutes its second capacitor plate. In the embodiment of FIGS. 5a and 5b, on the other hand, the polysilicon layer 5 constitutes the resistor R and the first capacitor plate of capacitor C, and the polysilicon layer 4 its second capacitor plate. In both cases, the function of the dielectric of capacitor C is assumed by the oxide layer 5.

Within FIGS. 2a–4b, the embodiments differ in that the path of the polysilicon layer 3 or 4 forming the second capacitor plate is contacted at different parts of the meander.

Figure 2A:
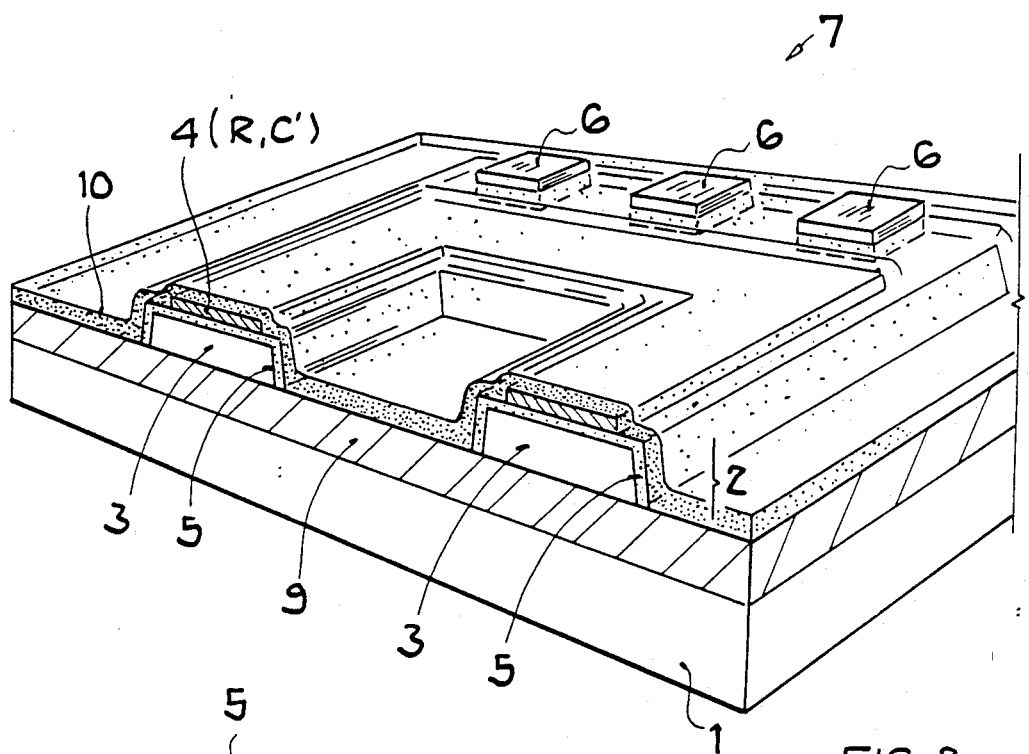
FIGS. 2a–5b are embodiments of RC lines according to the invention.
Figure 2B:
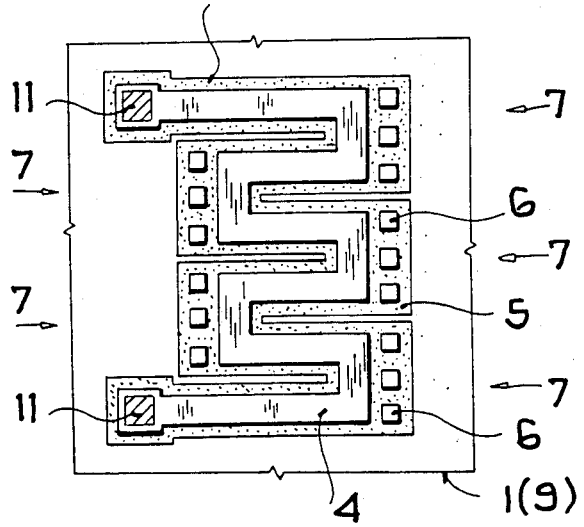

FIG. 2a shows, in a perspective partial view, an embodiment whose path of the polysilicon layer 3 forming the second capacitor plate is provided by means of the oxide layers 5 and 10 with aluminum contacts 6 at three points at the corners 7 of the meander. The plan view belonging to this embodiment is illustrated in FIG. 2b with six branches 8 and five corners 7, with the polysilicon layer 4 constituting the resistance path being provided with aluminum contacts 11 at each of both ends.

Figure 3A:
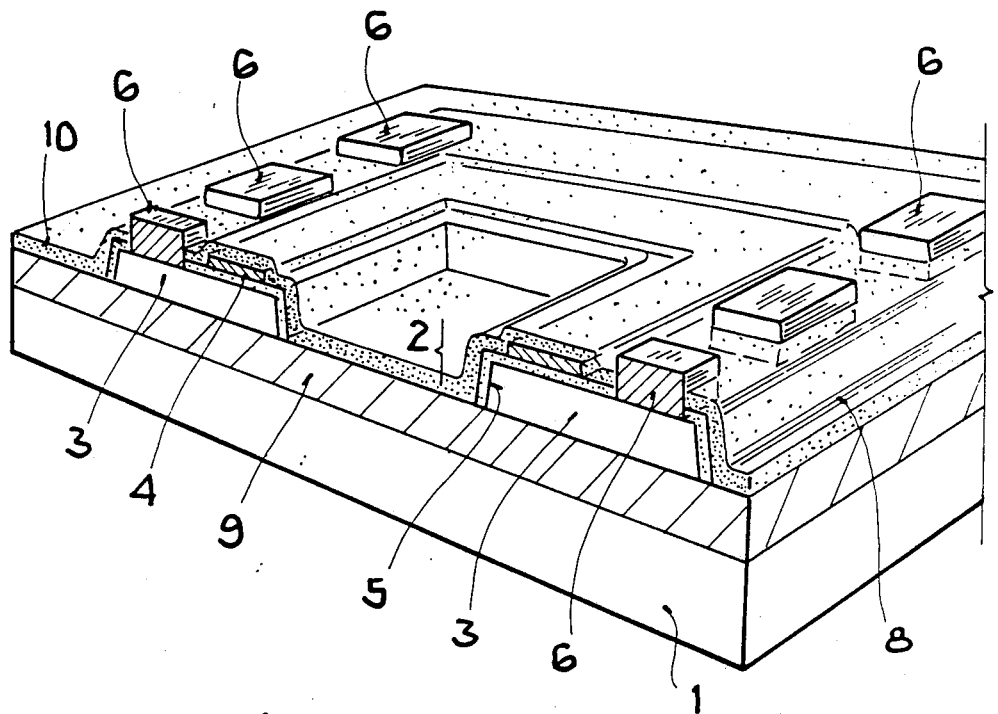
Figure 3B:
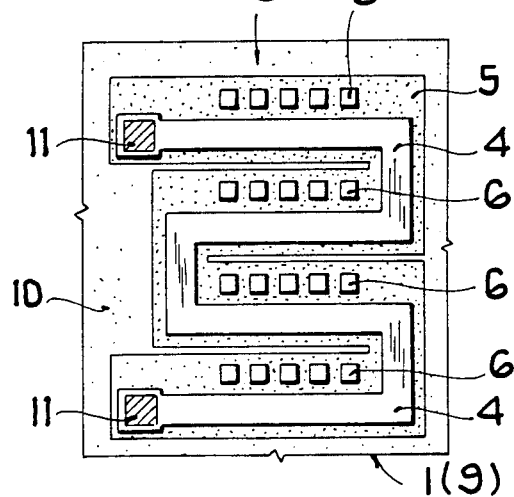
Figure 4A:
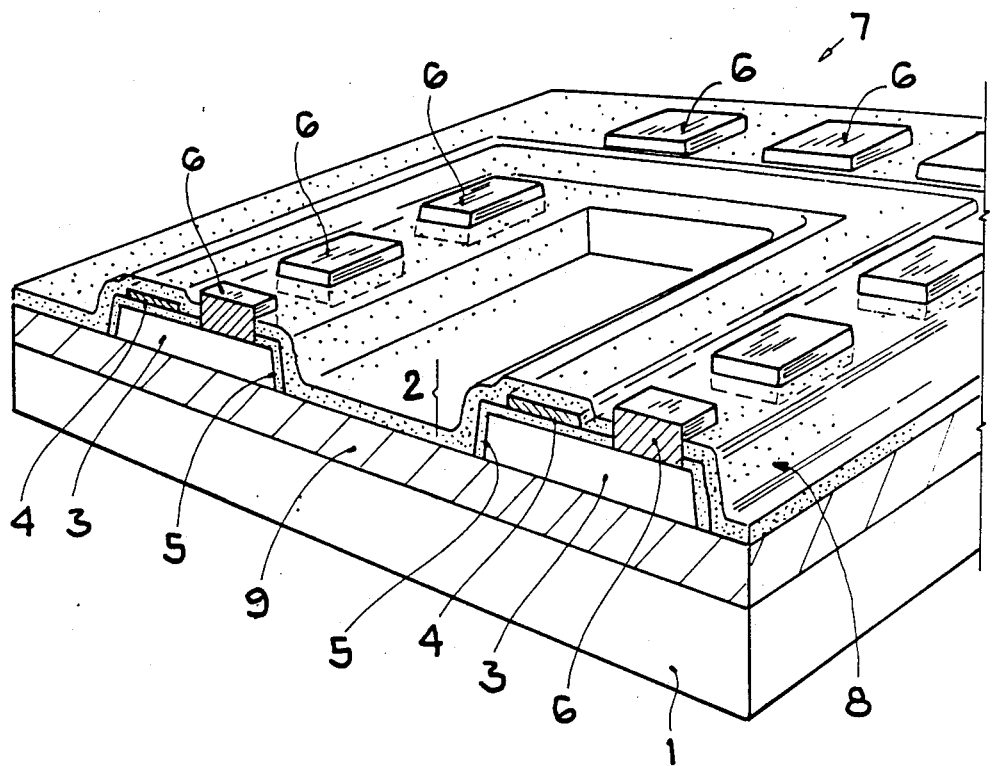
Figure 4B:
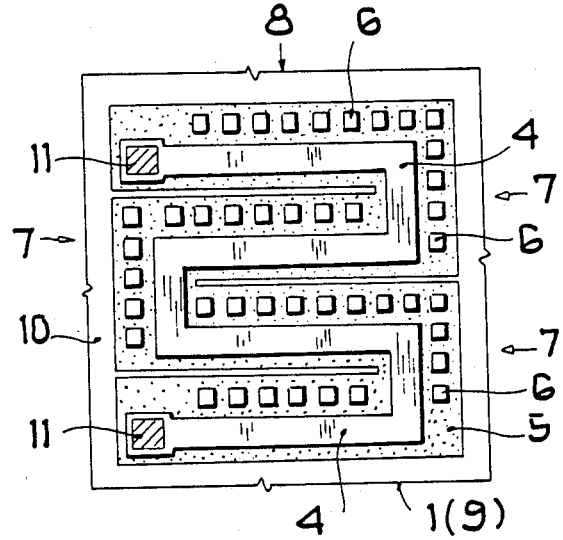

FIGS. 3a and 3b show an advantageous embodiment of the invention in which the six metal contacts 6 made of aluminum are arranged at the branches 8 of the meander. In a further embodiment illustrated in FIGS. 4a and 4b, the metal contacts 6 are arranged at both the corners 7 and the branches 8, by means of which the polysilicon layer 3 is contacted.

In a further preferred embodiment illustrated in FIGS. 5a and 5b, the path of the polysilicon layer 4 forming the second capacitor plate is provided at the corners 7 with three metal contacts 6 consisting of aluminum. In accordance with the contacting possibilities illustrated in FIGS. 3a to 4b, in this embodiment of the invention, too, the contacts 6 can be arranged at the branches 8 only or at both the corners 7 and the branches 8.

The longitudinal parasitic ohmic resistors $R_1$ are eliminated by the path of the polysilicon layer 3 or 4 forming the second capacitor plate being able to be connected sectionwise to the same potential.

Figure 6:
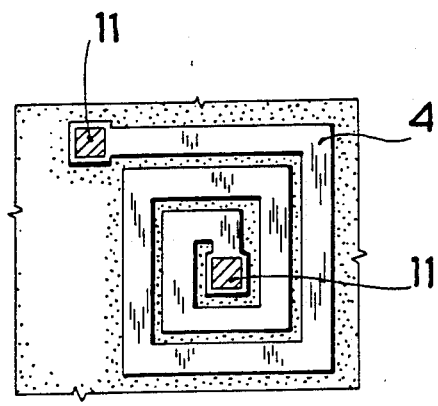
FIGS. 6 and 7 are embodiments of polysilicon paths which are structured in accordance with the invention.
Figure 7:
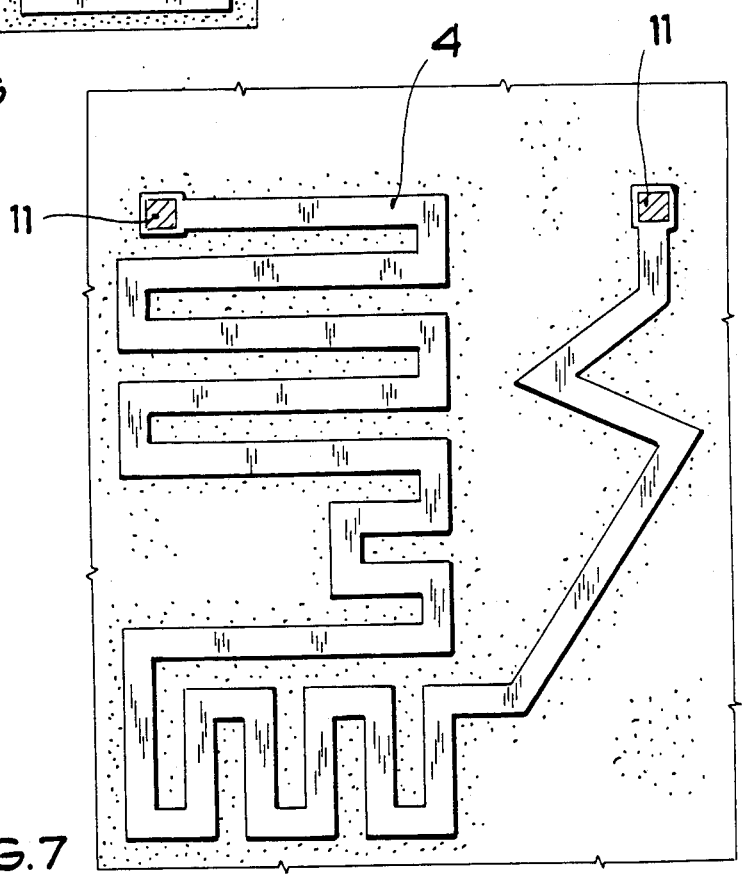

The conductor-path-type three-layer structure 2 may also have structures other than those shown in FIGS. 2a–5b, for example, the spiral-shaped structure shown in FIG. 6 or the irregular structure shown in Figure 7. For reasons of simplicity, only the path of the polysilicon layer 4 and the connection contacts 11 of the resistance path are illustrated.

What is claimed is:

1. In an RC line having a three-layer structure (2) disposed on a semiconductor substrate, and consisting of first and second conductive polysilicon layers and an oxide layer arranged between the polysilicon layers, with one of the polysilicon layers forming the ohmic resistor and simultaneously the first capacitor plate, with the other polysilicon layer constituting the second capacitor plate, and with the oxide layer being the dielectric the improvement wherein: each of the polysilicon layers has a strip-conductor-path structure and the oxide layer located therebetween has a strip-path structure, both the resistance path forming the first capacitor plate and the paths forming the second capacitor plate and the dielectric, respectively, are each folded or rolled in a spacesaving manner parallel to the plane of the semiconductor substrate, and the layers of the respective strip-paths lie in congruent superimposed relation to one another.

2. An RC line according to claim 1, the three-layer structure is arranged on a passivated semiconductor substrate.

3. An RC line according to claim 1, wherein several metal contacts, which are connected to a common potential, are arranged along and connected to the stripconductor path of the polysilicon layer forming the second capacitor plate.

4. An RC line according to claim 1, wherein the oxide layer forming the dielectric consists of $SiO_2$.

5. An RC line according to claim 1, wherein said first polysilicon layer is disposed on the semiconductor substrate below said second polysilicon layer and constitutes the ohmic resistor and the first capacitor plate, and the second polysilicon layer forms the second capacitor plate.

6. An RC line according to claim 1, wherein said first polysilicon layer is disposed on the semiconductor substrate below said second polysilicon layer and forms the second capacitor plate, and the second polysilicon layer constitutes the ohmic resistor and the first capacitor plate.

7. An RC line according to claim 1, wherein: both of said stripconductor-path polysilicon layers and said strip-path oxide layer forming the dielectric are of a meander-shaped configuration, including substantially parallel branches and connecting corners, and lie in congruent superimposed relation to one another; and metal contacts connected to a common potential are arranged at the corners of the meander-shaped path of the polysilicon layer forming the second capacitor plate.

8. An RC line according to claim 1, wherein: both of said strip conductor-path polysilicon layers and said strip-path oxide layer forming the dielectric are of meander-shaped configuration, including substantially parallel branches and connecting corners, and lie in congruent superimposed relation to one another; and metal contacts connected to a common potential are arranged at the branches of the meander-shaped path of the polysilicon layer forming the second capacitor plate.

9. An RC line according to claim 1, wherein: both of said strip-conductor-path polysilicon layers and strippath oxide layer forming the dielectric are of meandering configuration, including substantially parallel branches of connecting corners, and lie in congruent superimposed relation to one another; and metal contacts connected to a common potential are arranged at both the corners and the branches of the meander-shaped path of the polysilicon layer forming the second capacitor plate.

10. An RC line according to claim 1 further comprising a plurality of metal contacts, which are connected to a common potential, arranged along at least a portion of the folded paths and connected to the polysilicon layer forming the second capacitor plate.

11. An RC line according to claim 10 wherein the superimposed folded strip-paths have a meandering configuration.

* * * * *